(12) United States Patent
Chang et al.

(10) Patent No.: US 10,739,607 B2
(45) Date of Patent: Aug. 11, 2020

(54) LIGHT SOURCE MODULE, SENSING DEVICE AND METHOD FOR GENERATING SUPERPOSITION STRUCTURED PATTERNS

(71) Applicant: Industrial Technology Research Institute, Hsinchu (TW)

(72) Inventors: Hsueh-Chih Chang, Changhua County (TW); Mu-Tao Chu, Hsinchu (TW); Hung-Lieh Hu, Hsinchu (TW); Jui-Ying Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 101 days.

(21) Appl. No.: 16/172,882

(22) Filed: Oct. 29, 2018

(65) Prior Publication Data

US 2019/0293954 A1    Sep. 26, 2019

Related U.S. Application Data

(60) Provisional application No. 62/646,379, filed on Mar. 22, 2018.

(30) Foreign Application Priority Data

Aug. 15, 2018    (TW) .............................. 107128515 A

(51) Int. Cl.
*G01B 11/24* (2006.01)
*G02B 27/42* (2006.01)
(Continued)

(52) U.S. Cl.
CPC ........ *G02B 27/425* (2013.01); *G01B 11/2513* (2013.01); *G02B 27/106* (2013.01);
(Continued)

(58) Field of Classification Search
CPC ....... G06T 7/0057; G01B 11/24; G01B 11/25; G01B 11/306; G01B 11/245
(Continued)

(56) References Cited

U.S. PATENT DOCUMENTS 8,405,823 B2   3/2013   Pfaff
8,749,796 B2   6/2014   Pesach et al.
(Continued)

FOREIGN PATENT DOCUMENTS

CN   103472457   6/2015
CN   105675150   6/2016
(Continued)

OTHER PUBLICATIONS

Office Action of Taiwan Counterpart Application, dated Aug. 5, 2019, p. 1-p. 5.
(Continued)

*Primary Examiner* — Md M Rahman
(74) *Attorney, Agent, or Firm* — JCIPRNET

(57) ABSTRACT

A light source module adapted to provide a superposition structured pattern includes a light emitting device adapted to provide a light beam, a light guiding element including a polarizing beam splitter to separate the light beam into a first light beam and a second light beam, a first diffractive element configured to convert the first light beam into a first structured light, and a second diffractive element configured to convert the second light beam into a second structured light. Polarization states of the first light beam and the second light beam are different. The first and second structured lights are projected into a projection region, and overlapped and imaged as a superposition structured pattern. The projection region has sub-projection regions arranged in a matrix and adjacent to each other, and the pattern distri-
(Continued)

bution of the superposition structured pattern in each sub-projection region is different from each other.

20 Claims, 14 Drawing Sheets

(51) Int. Cl.
| | | |
|---|---|---|
| *G01B 11/25* | (2006.01) | |
| *G02B 27/10* | (2006.01) | |
| *H01S 5/42* | (2006.01) | |
| *G02B 27/30* | (2006.01) | |
| *G06T 7/521* | (2017.01) | |
| *H01S 5/00* | (2006.01) | |

(52) U.S. Cl.
CPC ......... *G02B 27/1086* (2013.01); *G02B 27/30* (2013.01); *G06T 7/521* (2017.01); *H01S 5/005* (2013.01); *H01S 5/423* (2013.01)

(58) Field of Classification Search
USPC .......................................................... 356/601
See application file for complete search history.

(56) References Cited

U.S. PATENT DOCUMENTS

| | | | |
|---|---|---|---|
| 8,933,876 B2 | 1/2015 | Galor et al. | |
| 8,989,455 B2 | 3/2015 | Shor et al. | |
| 9,946,089 B2 | 4/2018 | Chen et al. | |
| 2003/0131994 A1* | 7/2003 | Vinegar | E21B 43/243 |
| | | | 166/256 |
| 2015/0160002 A1 | 6/2015 | Nayar | |
| 2017/0115497 A1 | 4/2017 | Chen et al. | |
| 2017/0239719 A1* | 8/2017 | Buller | B33Y 40/00 |
| 2017/0239720 A1* | 8/2017 | Levin | B29C 64/40 |

FOREIGN PATENT DOCUMENTS

| | | |
|---|---|---|
| CN | 107039885 | 8/2017 |
| TW | 201319626 | 5/2013 |
| TW | 201706675 | 2/2017 |
| TW | 201710642 | 3/2017 |
| WO | 2018001751 | 1/2018 |

OTHER PUBLICATIONS

Haeman et al, "Repid 2D-to 3D conversion," Proceedings of SPIE, vol. 4660, May 23, 2002, pp. 78-86.

* cited by examiner

LIGHT SOURCE MODULE, SENSING DEVICE AND METHOD FOR GENERATING SUPERPOSITION STRUCTURED PATTERNS

CROSS-REFERENCE TO RELATED APPLICATION

This application claims the priority benefits of U.S. provisional application Ser. No. 62/646,379, filed on Mar. 22, 2018 and Taiwan application serial no. 107128515, filed on Aug. 15, 2018. The entirety of each of the above-mentioned patent applications is hereby incorporated by reference herein and made a part of this specification.

TECHNICAL FIELD

The disclosure relates to an optical device and a method of generating structured light, and more particularly to a light source module, a sensing device, and a method of generating a superposition structured pattern.

BACKGROUND

In the current 3D sensing technology, 3D measurement is mainly performed through a triangulation method and a time delay method. At present, three 3D sensing technologies, i.e., a stereo vision technology, a structured light technology, and a time of flight (ToF) technology have advantages in price, volume, and performance.

According to the structured light technology among the three 3D sensing technologies, a structured light pattern is projected to a to-be-tested object, and a camera or another image capturing device is applied to capture image information to measure the distance, thereby obtaining the 3D information of the to-be-tested object. Therefore, how to design a useful structured light with high resolution is one of the research topics to which people skilled in the art endeavor.

SUMMARY

The disclosure provides a light source module, a sensing device, and a method of generating a superposition structured pattern, whereby structured light may be provided, and the structured light has different pattern distributions at different projection positions.

In an exemplary embodiment, a light source module adapted to provide a superposition structured pattern is provided. The light source module includes a light emitting device, a light guiding element, a first diffractive element, and a second diffractive element. The light emitting device is adapted to provide a light beam. The light guiding element is arranged on a transmission path of the light beam. The light guiding element includes a polarizing beam splitter to separate the light beam into a first light beam and a second light beam. The first diffractive element is arranged on a transmission path of the first light beam, so as to convert the first light beam into a first structured light. The second diffractive element is disposed on a transmission path of the second light beam, so as to convert the second light beam into a second structured light. Here, a polarization state of the first light beam is different from a polarization state of the second light beam. The first structured light and the second structured light are projected into a projection region, and overlapped and imaged as a superposition structured pattern. The projection region has a plurality of sub-projection regions arranged in a matrix and adjacent to each other, and the pattern distribution of the superposition structured pattern in each of the sub-projection regions is different from each other.

In an exemplary embodiment, a sensing device including the aforesaid light source module and an image capturing element is further provided. The image capturing element is configured to capture images in the projection region.

In an exemplary embodiment, a method of generating a superposition structured pattern is further provided, and the method includes a step of providing a light beam to a light guiding element, a step of generating a first structured light and a second structured light with different polarization states by a light guiding element, and a step of projecting the first structured light and the second structured light to a projection region, so that the first structured light and the second structured light are overlapped and imaged as a superposition structured pattern. Here, the projection region has a plurality of sub-projection regions arranged in a matrix and adjacent to each other, and a pattern distribution of the superposition structured pattern in each of the sub-projection regions is different from each other.

In view of the above, in the light source module, the sensing device, and the method for generating the superposition structured pattern, the light emitting device of the light source module provides the light beam to the light guiding element and generates the first structured light and the second structured light with different polarization states through the light guiding element. The first structured light and the second structured light are projected into the projection region, so that the first structured light and the second structured light are overlapped and imaged as a superposition structured pattern. Thereby, the depth information of the illuminated object may be identified according to the difference in the pattern distribution in each sub-projection region and the variation amount thereof.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
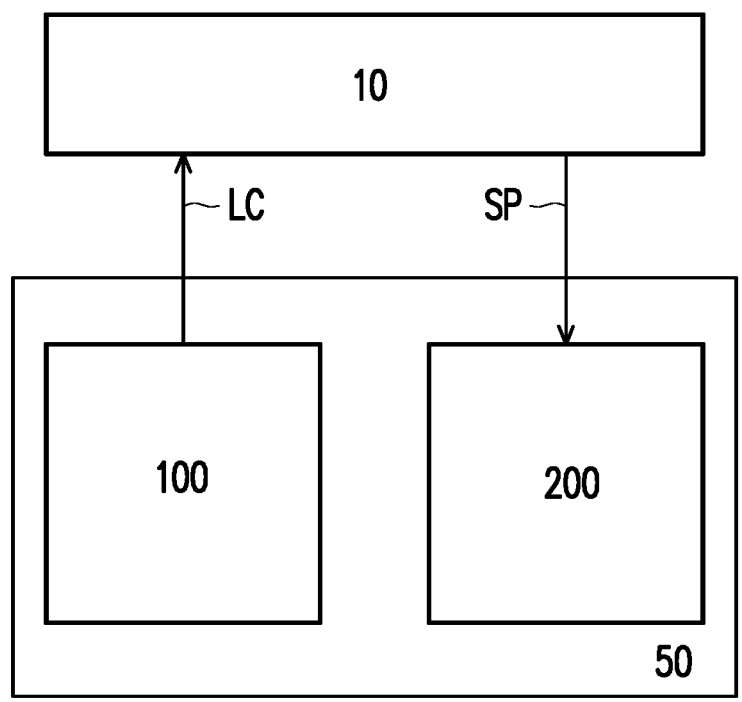
FIG. 1 is a schematic diagram illustrating a sensing device according to an exemplary embodiment.

FIG. 1 is a schematic diagram illustrating a sensing device according to an exemplary embodiment. With reference to FIG. 1, in the present embodiment, a sensing device 50 includes a light source module 100 and an image capturing element 200, and the light source module 100 and the image capturing element 200 are electrically connected to each other. The sensing device 50 is adapted to sense a target object 10 in a 3D manner, thereby identifying the appearance characteristics or depth information of the target object 10. The target object 10 is a street view object or a human face, for instance, which should not be construed as a limitation in the disclosure.

During the 3D sensing action, the sensing device 50 sends a superposition structured light LC to the target object 10 through the light source module 100, so that the resultant superposition structured pattern SP has different pattern distributions along with different depth positions of the target object 10. After the superposition structured light LC is projected, the sensing device 50 performs an image capturing action on the target object 10 through the image capturing element 200, so as to recognize the depth value of the target object 10 corresponding to the projection position through capturing the superposition structural pattern SP and further obtain the 3D information of the target object 10.

Figure 2:
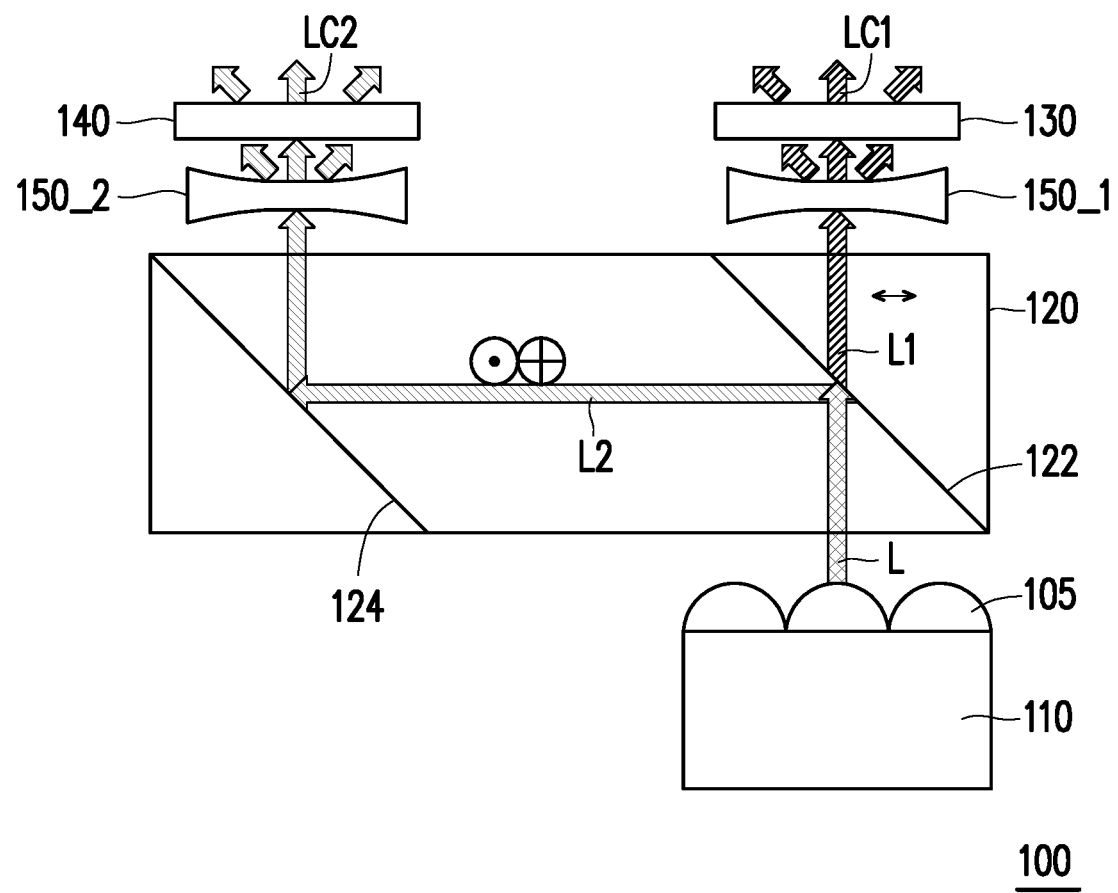
FIG. 2 is a schematic diagram illustrating a light source module according to an exemplary embodiment.

FIG. 2 is a schematic diagram illustrating a light source module according to an exemplary embodiment. With reference to FIG. 1 and FIG. 2, particularly, in the present embodiment, the light source module 100 includes a light emitting device 110, a light guiding element 120, a first diffractive element 130, and a second diffractive element 140. The light emitting device 110 is adapted to provide a light beam L to the light guiding element 120. Namely, the light guiding element 120 is disposed on a transmission path of the light beam L. The light emitting device 110 is, for instance, a plurality of semiconductor lasers or light emitting diodes arranged in a matrix. Here, the semiconductor laser is, for instance, vertical-cavity surface-emitting laser (VCSEL) or photonic crystal laser. In the present embodiment, the light emitting device 110 is exemplified as the VCSEL, which should not be construed as a limitation in the disclosure. According to the present embodiment, a collimation lens set 105 is disposed on the light emitting device 110, so as to collimate the light beam L into the light guiding element 120, which should however not be construed as a limitation in the disclosure.

Figure 3:
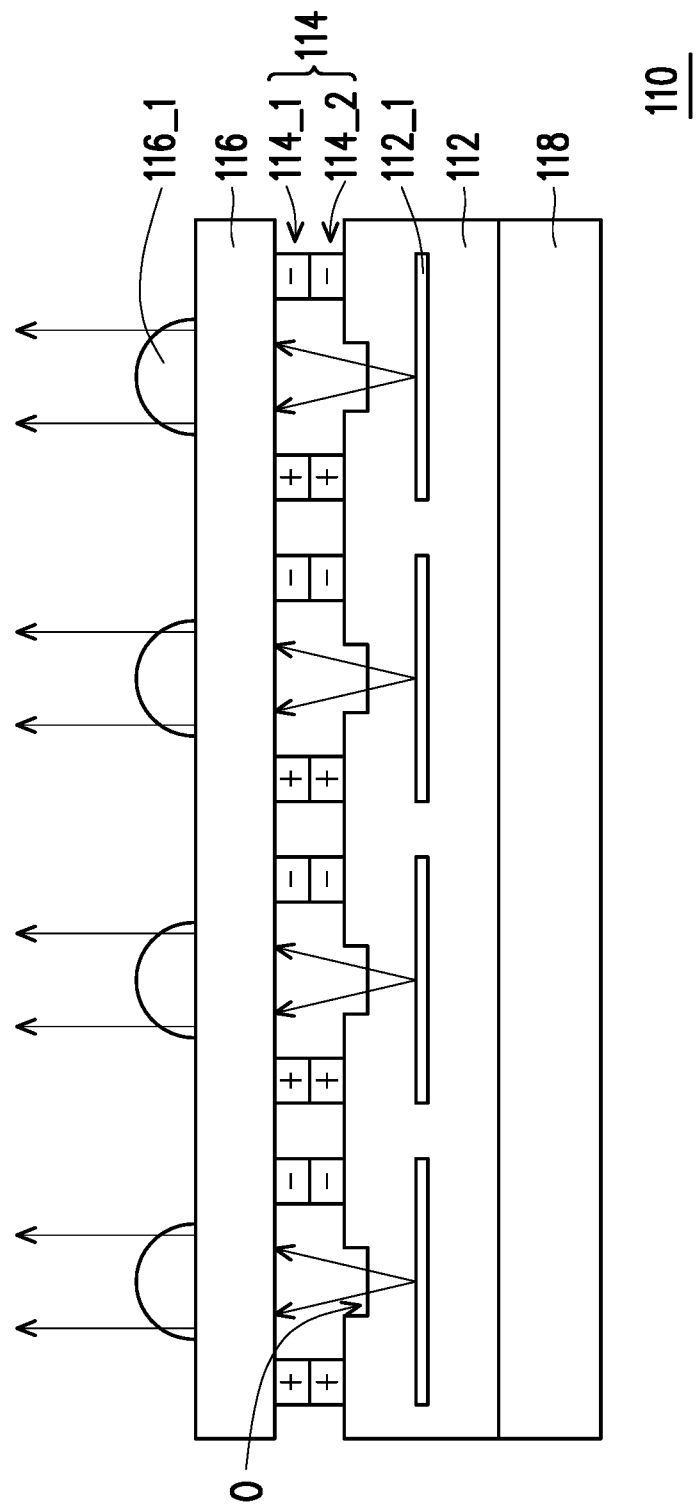
FIG. 3 is a schematic diagram illustrating the light emitting device depicted in FIG. 2.

FIG. 3 is a schematic diagram illustrating the light emitting device depicted in FIG. 2. Please refer to FIG. 2 and FIG. 3. Specifically, in the present embodiment, the light emitting device 110 includes a light emitting element 112, a driver circuit 114, a control substrate 116, and a heat conducting substrate 118. The light emitting element 112 is configured to emit light toward the light guiding element 120. The light emitting element 112 may be formed by a plurality of light emitting units 112_1 arranged in a matrix or may be integrally formed. Namely, in the present embodiment, the light emitting element 112 is, for instance, a VCSEL matrix, the light emitting unit 112_1 is, for instance, one single VCSEL, and each of the VCSELs corresponds to one light emitting end O.

The control substrate 116 is disposed on one side of the light emitting element 112 adjacent to the light emitting end O and configured to control the output light of the light emitting element 112 by a circuit. The substrate 116 is, for instance, a silicon substrate. The heat conducting substrate 118 is disposed on the other side of the light emitting element 112 opposite to the light emitting end O and configured to direct the heat generated by light emitting element 112 to the outside. The other side of the control substrate 116 opposite to the light emitting element 112 may be integrated with an optical structure such as a lens, a microstructure, a grating, an optical waveguide, or photonic crystal, so that the optical structure may be applied to modulate the light emitting characteristics of the light emitting element 112 due to the infrared light transmissive property. For instance, in the present embodiment, focal structures 116_1 are formed on the other side of the control substrate 116 opposite to the light emitting element 112 and configured to focus light emitted by the light emitting element 112. That is, in the present embodiment, the aforesaid collimation lens set 105 is directly formed by the control substrate 116; in some embodiments, the collimation lens set 105 may be an additional optical structure or optical element, which should not be construed as a limitation in the disclosure.

The driver circuit 114 is disposed between the light emitting element 112 and the control substrate 116 and configured to electrically connect the light emitting element 112 and the control substrate 116 and further control the output light of each light emitting unit 112_1 through a control signal that is externally provided. Particularly, the driver circuit 114 is formed by connecting a matrix control circuit 114_1 and a plurality of connection pads 114_2, for instance, which should however not be construed as a limitation in the disclosure. It may be learned from the configuration described above that the driver circuit 114 provided in the present embodiment may be formed on the surface having the light emitting end O of the light emitting element 112 without posing any negative impact on the light emitting performance of the light emitting element 112. Therefore, in the present embodiment, the output light of different light emitting units 112_1 in the light emitting device 110 may be controlled by the circuit according to the present embodiment, so as to achieve the effect of point control or region control.

Figure 4:
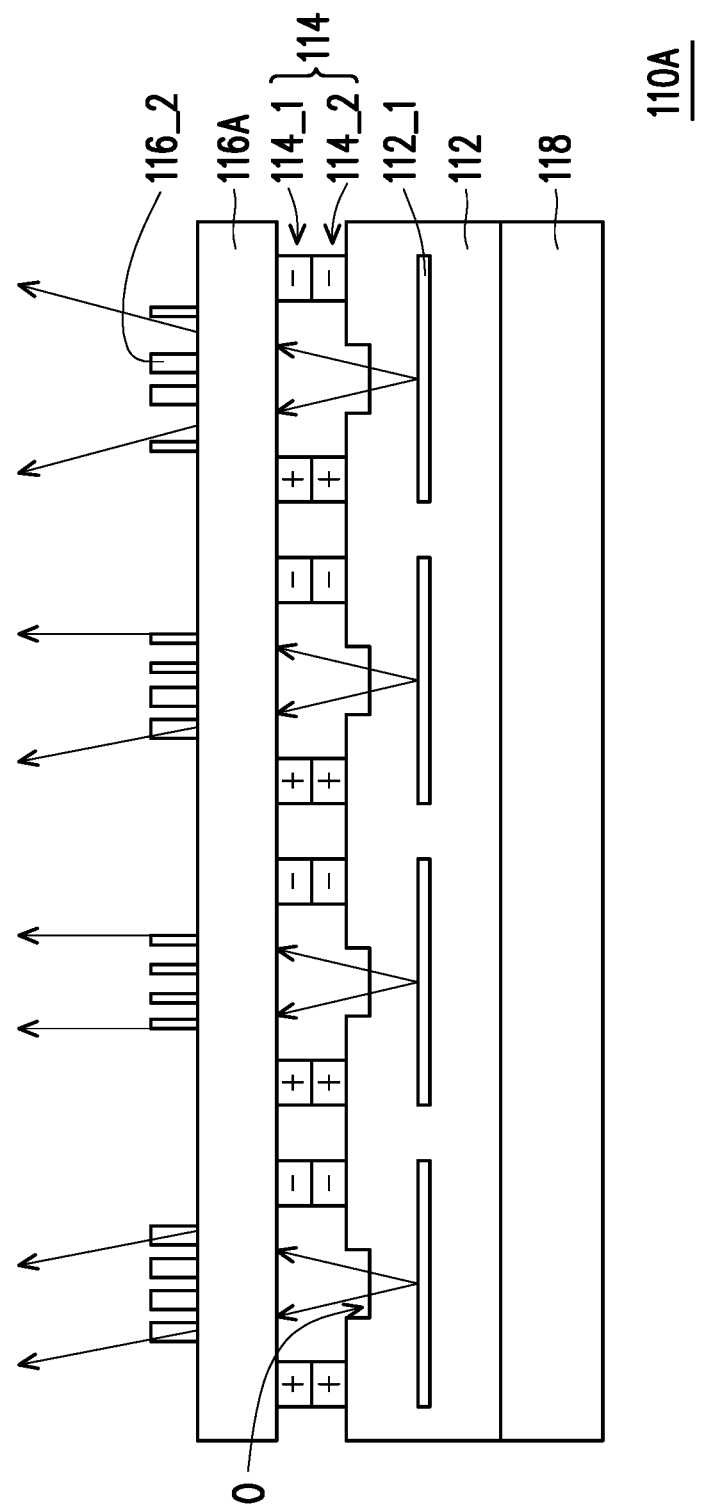
FIG. 4 is a schematic diagram illustrating a display device according to another exemplary embodiment.

FIG. 4 is a schematic diagram illustrating a display device according to another exemplary embodiment. Please refer to FIG. 4. The light emitting device 110A provided in the present embodiment is similar to the light emitting device 110 depicted in FIG. 3, while the difference therebetween lies in that grating structures 116_2 are formed on the other side of the control circuit 116A opposite to the light emitting element 112 according to the present embodiment, so as to further adjust and control the light emitting characteristics of the light emitting element 112. As such, each of the light emitting units 112_1 in the light emitting element 112 may achieve different light emitting effects. In some embodiments, the focal structures 116_1 (as shown in FIG. 3) and the grating structures 116_2 may be simultaneously formed, which should not be construed as a limitation in the disclosure.

Figure 5:
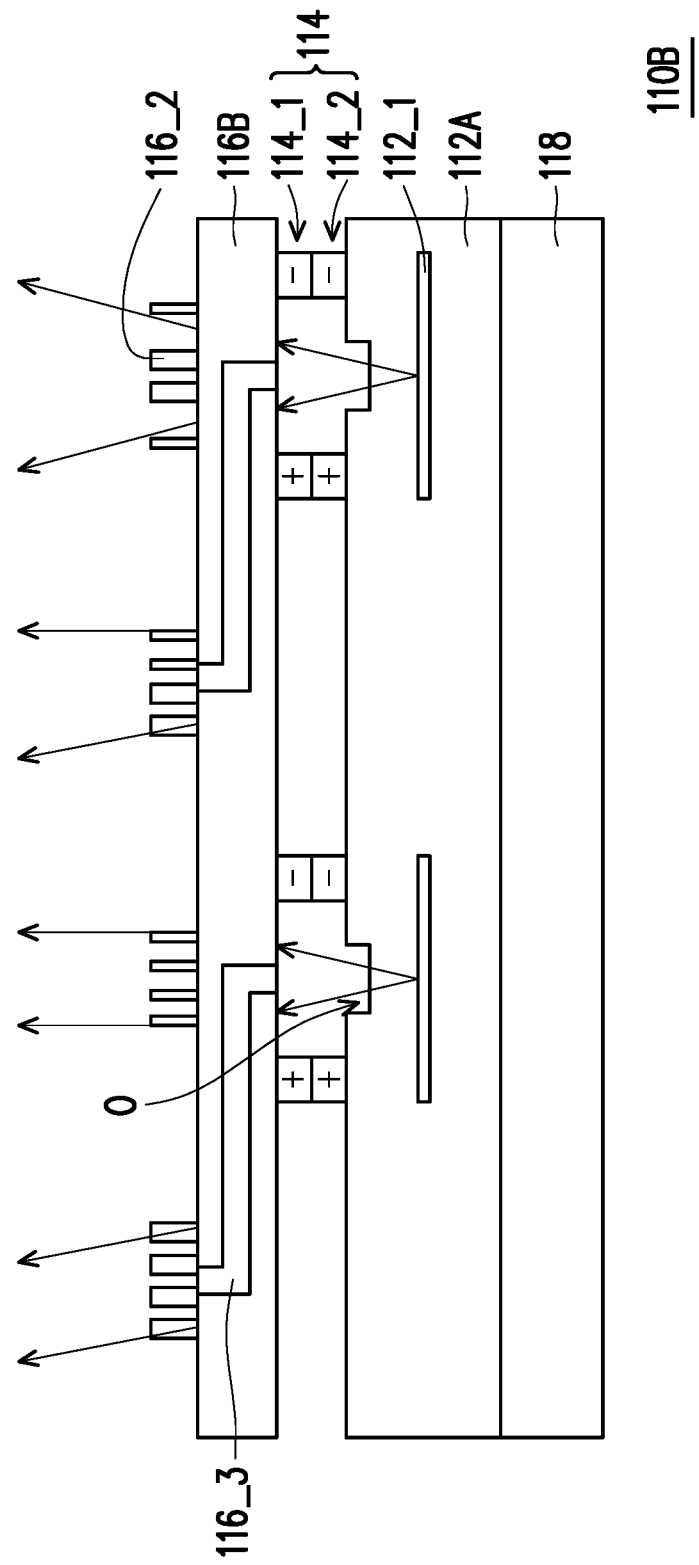
FIG. 5 is a schematic diagram illustrating a display device according to another exemplary embodiment.

FIG. 5 is a schematic diagram illustrating a display device according to another exemplary embodiment. Please refer to FIG. 5. The light emitting device HOB provided in the present embodiment is similar to the light emitting device 110A depicted in FIG. 4, while the difference therebetween lies in that the control substrate 116B provided in the present embodiment further includes a plurality of light guiding structures 116_3 located in the inside of the body of the control substrate 116B and configured to guide a portion of the light emitted by the light emitting element 112A to the adjacent grating structures 116_2 or focal structures 116_1 (as shown in FIG. 3). According to the present embodiment, the light guiding structures 116_3 are, for instance, silicon light guide or photonic crystal, which should not be construed as a limitation in the disclosure. As such, the density of the light emitting units 112_1 in the light emitting element 112A may be further reduced, and the costs may be saved.

The light guiding element 120 includes a polarizing beam splitter 122 to split the light beam L to a first light beam L1 and a second light beam L2, and the polarization state of the first light beam L1 is different from the polarization state of the second light beam L2. Specifically, the light beam L provided by the light emitting device 110 is an unpolarized light or a linear polarized light that is obliquely related to an incident surface. When the light beam L is transmitted to the polarizing beam splitter 122, the light beam L is divided into the first light beam L1 and the second light beam L2 with specific polarization directions, and the polarization direction of the first light beam L1 is perpendicular to the polarization direction of the second light beam L2. One of the first light beam L1 and the second light beam L2 passes through the polarizing beam splitter 122, and the other is reflected by the polarizing beam splitter 122. In the present embodiment, the first light beam L1 passes through the polarizing beam splitter 122, and the second light beam L2 is reflected by the polarizing beam splitter 122. Hence, the light guiding element 120 of the light source module 100 may be applied to generate to light beams with different polarization states, e.g., the polarization directions shown in FIG. 2. An angle between an extension direction of the polarizing beam splitter 122 and a transmission direction of the light beam L is 45 degrees; however, in other embodiments, the angle may have another value, which should not be construed as a limitation in the disclosure.

In the present embodiment, the light guiding element 120 further includes a reflector 124 disposed on a transmission path of the second light beam L2 and configured to reflect the second light beam L2. In particular, when the polarizing beam splitter 122 generates the first light beam L1 and the second light beam L2, the first light beam L1 passes through the polarizing beam splitter 122 and is emitted from a light output side of the light guiding element 120. The second light beam L2 is reflected by the polarizing beam splitter 122, transmitted to the reflector 124, reflected by the reflector 124, and emitted from the light output side of the light guiding element 120. The polarizing beam splitter 122 and the reflector 124 are respectively formed in the light guiding element 120 through coating, or the polarizing beam splitter 122 and the reflector 124 may be coating elements assembled to a transparent element, which should not be construed as a limitation in the disclosure.

Figure 6A:
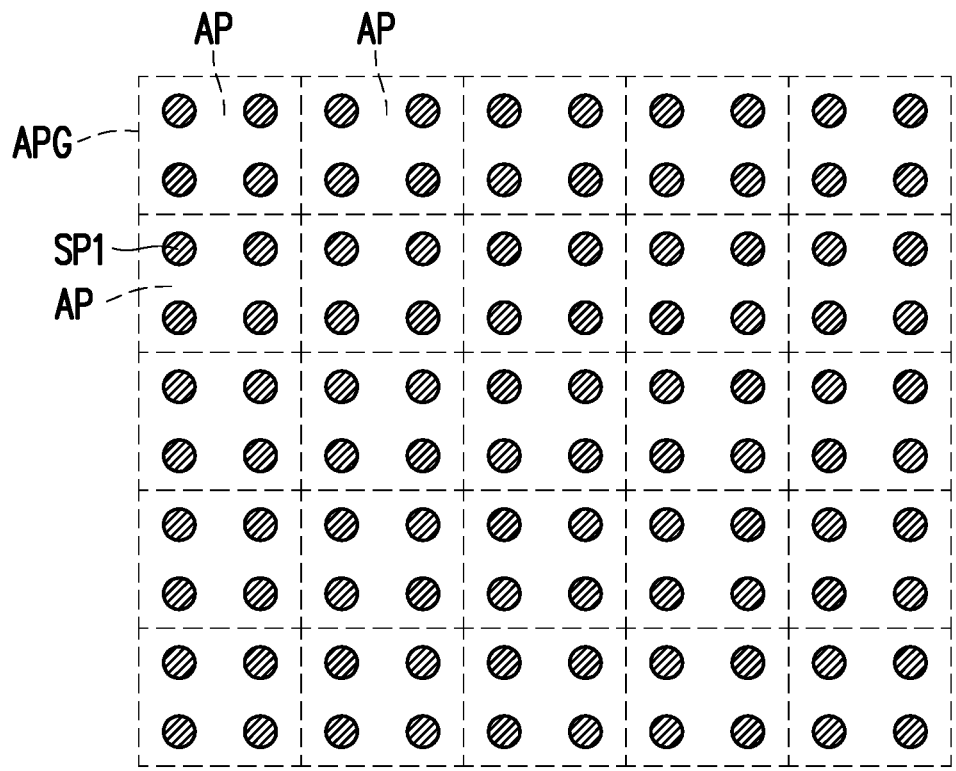
FIG. 6A is a schematic diagram illustrating pattern distribution of a first structured light according to an exemplary embodiment.
Figure 6B:
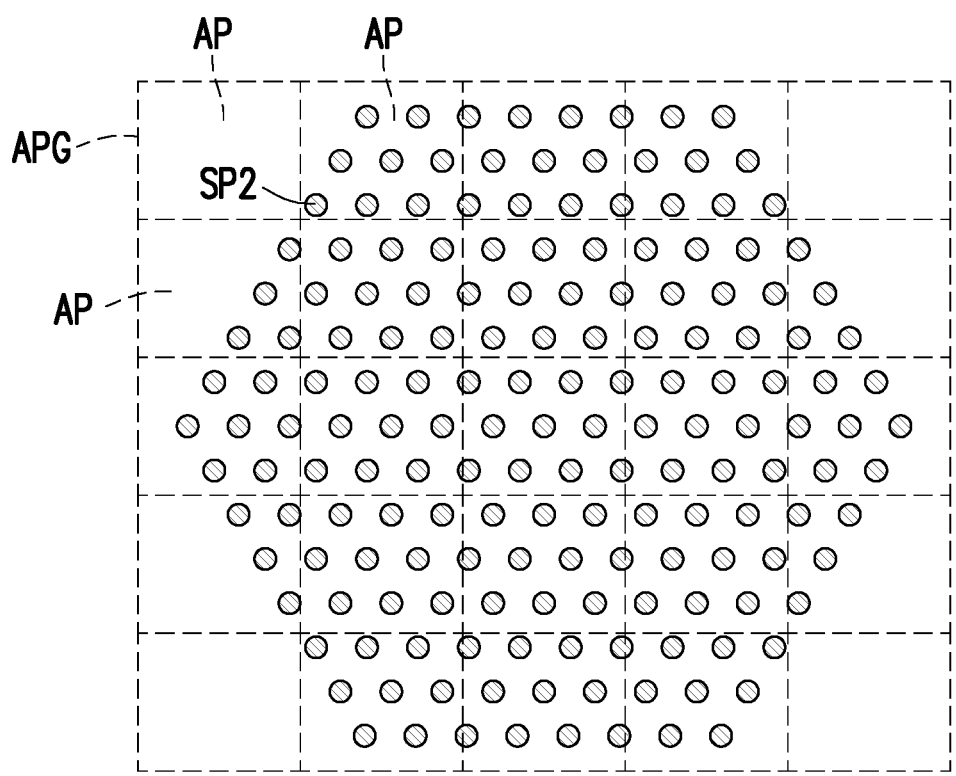
FIG. 6B is a schematic diagram illustrating pattern distribution of a second structured light according to an exemplary embodiment.
Figure 6C:
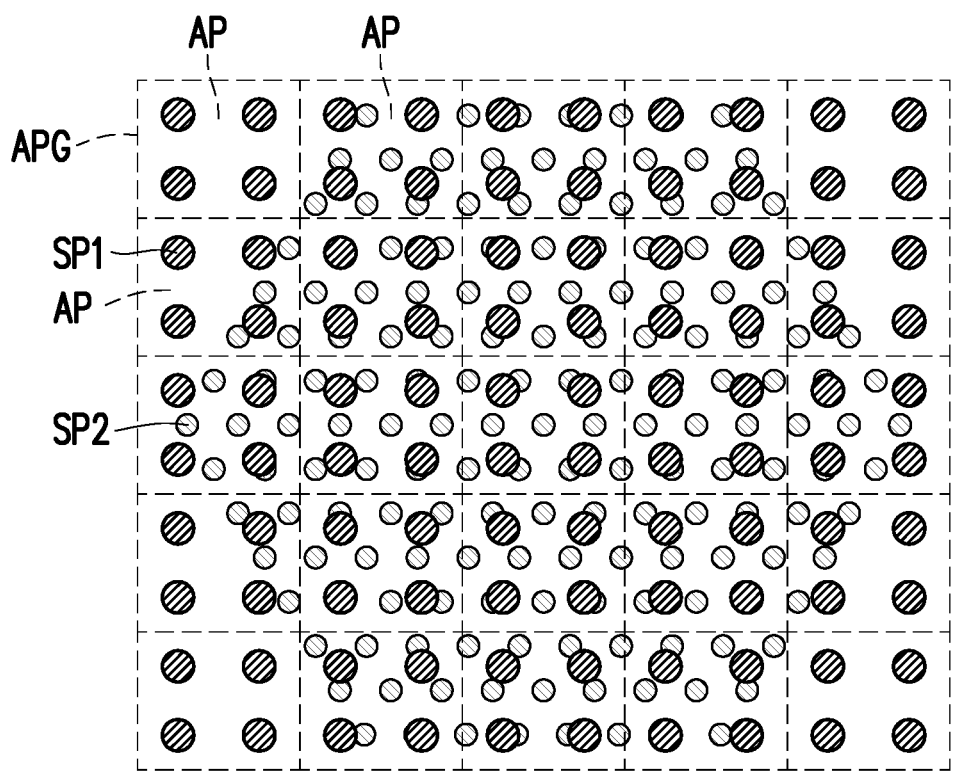
FIG. 6C is a schematic diagram illustrating that the first structured light in FIG. 6A and the second structured light in FIG. 6B are overlapped in a projection region and imaged as a superposition structured pattern.

FIG. 6A is a schematic diagram illustrating pattern distribution of a first structured light according to an exemplary embodiment. FIG. 6B is a schematic diagram illustrating pattern distribution of a second structured light according to an exemplary embodiment. FIG. 6C is a schematic diagram illustrating that the first structured light in FIG. 6A and the second structured light in FIG. 6B are overlapped in a projection region and imaged as a superposition structured pattern. With reference to FIG. 2 and FIG. 6A-FIG. 6C, the first diffractive element 130 and the second diffractive element 140 are respectively disposed on the transmission path of the first light beam L1 and the transmission path of the second light beam L2. The first diffractive element 130 is configured to convert the first light beam L1 into a first structured light LC1, and the second diffractive element 140 is configured to convert the second light beam L2 into a second structured light LC2. The first structured light LC1 and the second structured light LC2 are projected toward the target object 10 in the same transmission direction and are projected in a projection region and overlapped and imaged as the superposition structured pattern SP, as shown in FIG. 6C. Here, the projection region may be considered as a plurality of sub-projection regions AP arranged in a matrix and adjacent to each other.

In detail, the first diffractive element 130 and the second diffractive element 140 may be active diffractive elements or passive diffractive elements. The active diffiactive elements are, for instance, liquid crystal matrix devices, spatial light modulators (SLM), or liquid crystal on silicon (LCoS), and the passive diffractive elements are, for instance, gratings or diffiactive optical elements (DOE) with different patterns or different optical structure. If the first diffractive element 130 and the second diffractive element 140 are the active diffractive elements, the pattern distribution of the first structured light LC1 and the second structured light LC2 may be further adjusted by the first diffractive element 130 and the second diffractive element 140.

The projection region on a surface of the target object 10 faces the sensing device 50, for instance. Therefore, the pattern of the first structured light LC1 projected in the projection region APG and the pattern of the second structured light LC2 projected in the projection region APG are different. Specifically, the first structured light LC1 and the second structured light LC2 are respectively imaged as a first structured pattern SP1 and a second structured pattern SP2 in the projection region APG, and the first structured pattern SP1 and the second structured pattern SP2 include dot matrix patterns with different arrangement periods, as shown in FIG. 6A and FIG. 6B. In the present embodiment, the way to arrange the first structured pattern SP1 and the second structured pattern SP2 and the spot size of the first structured pattern SP1 and the second structured pattern SP2 are different, which should however not be construed as a limitation in the disclosure. In other embodiments, the second diffractive element 140 may be the active diffiactive element, so that the pattern distribution of the second structured light LC2 may be further adjusted by the second diffractive element 140, which should not be construed as a limitation in the disclosure.

Hence, the pattern distribution of the superposition structured pattern SP in each of the sub-projection regions AP is different from each other. That is, the pattern distribution in each sub-projection area AP is unique. Thereby, according to the variation amount of the pattern distribution in each sub-projection region AP, the variations in depth of each part of the target object 10 corresponding to the sub-projection region AP may be identified, and depth information of each part of the target object 10 may be further obtained. In the present embodiment, an overlapping ratio of a first projection area defined by a projection boundary of the first structured light LC1 to a second projection area defined by a projection boundary of the second structured light LC2 in the projection region APG is greater than 80%, which should not be construed as a limitation in the disclosure.

Since the polarization directions of the first structured light LC1 and the second structured light LC2 are different, the refractive index and the reflectivity for a light transmissive material may also be different. That is, the target object 10 may be made of a light transmissive material, and the sensing device 50 may perform a sensing action on the target object 10 through the first structured light LC1 and the second structured light LC2 with different polarization states. In some embodiments, back end computations may be performed by an additional processor, so as to further determine the appearance characteristics of the light transmissive material.

Figure 7:
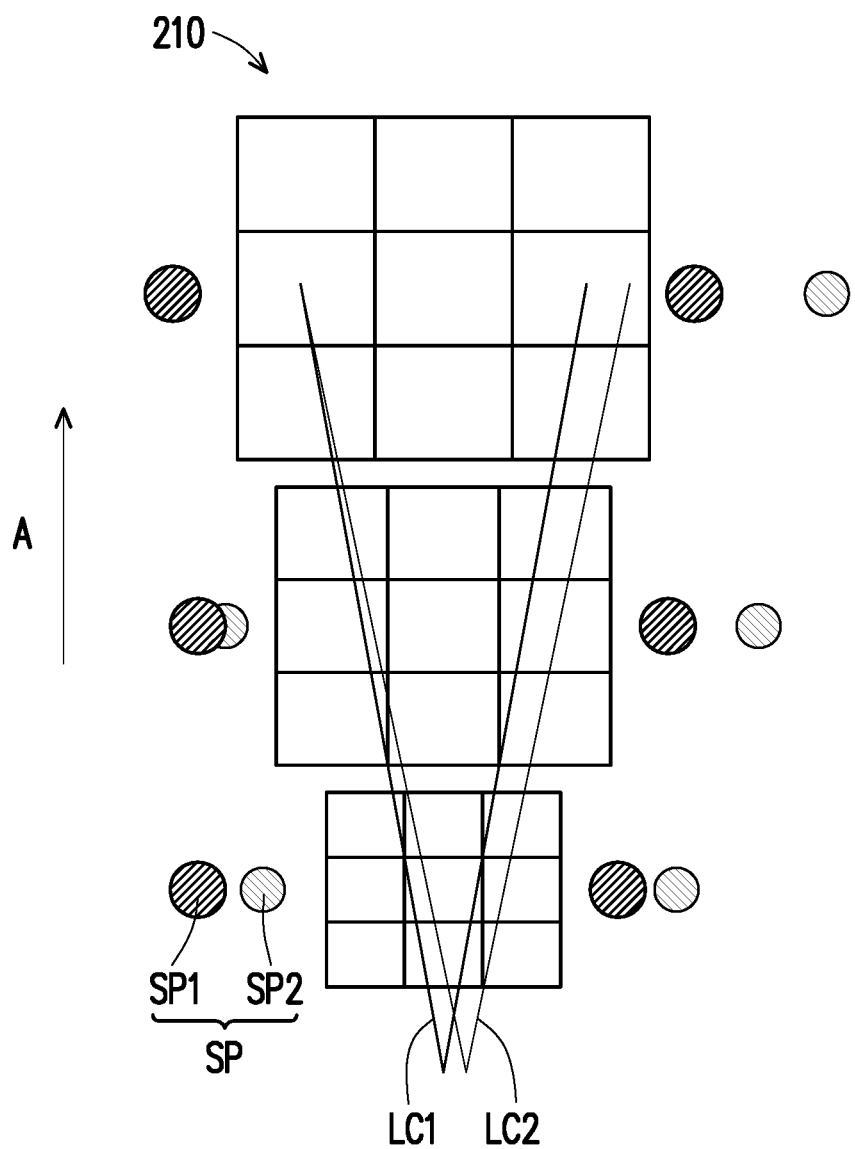
FIG. 7 is a schematic diagram illustrating that a first structured light and a second structured light are partially overlapped and imaged as a superposition structured pattern at different distances in the projection region.

FIG. 7 is a schematic diagram illustrating that a first structured light and a second structured light are partially overlapped and imaged as a superposition structured pattern at different distances in the projection region. With reference to FIG. 1, FIG. 2, and FIG. 7, in the present embodiment, the light source module 100 further includes a first light beam adjusting element 150_1 and a second light beam adjusting element 150_2 which are respectively disposed on transmission paths of the first light beam L1 and the second light beam L2. The first light beam adjusting element 150_1 and the second light beam adjusting element 150_2 are, for instance, a single optical lens or a divergence lens kit set. The first light beam adjusting element 150_1 is located between the first diffractive element 130 and the light guiding element 120, and the second light beam adjusting element 150_2 is located between the second diffractive element 140 and the light guiding element 120. Hence, the first light beam L1 and the second light beam L2 can evenly irradiate the first diffractive element 130 and the second diffractive element 140. However, in some embodiments, the light source module 100 may be equipped with only one light beam adjusting element, which should not be construed as a limitation in the disclosure.

In the present embodiment, note that the first structured light LC1 and the second structured light LC2 may be projected toward the target object 10 at different divergence angles; that is, the divergence angle of the first structured light LC1 is different from the divergence angle of the second structured light LC2. Namely, if the divergence angle of the first light beam adjusting element 150_1 is different from the divergence angle of the second light beam adjusting element 150_2, or if the divergence angles of the first diffractive element 130 and the second diffractive element 140 are different, the divergence angles at which the first structured light LC1 and the second structured light LC2 are projected toward the projection region are different, which results in changes to the pattern spacing or the degree of superposition of the first structured pattern SP1 and the second structured pattern SP2 in response to different positions in a projection direction A, as shown in FIG. 7. That is, changes to depth of parts of the target object 10 may be further recognized according to variations in the pattern spacing or the degree of superposition. Detailed steps and the implementation manner of the method of identifying the depth information by the sensing device 50 according to different pattern distributions may be sufficiently taught or suggested by the general knowledge in the pertinent field and therefore will not be described below.

Figure 8A:
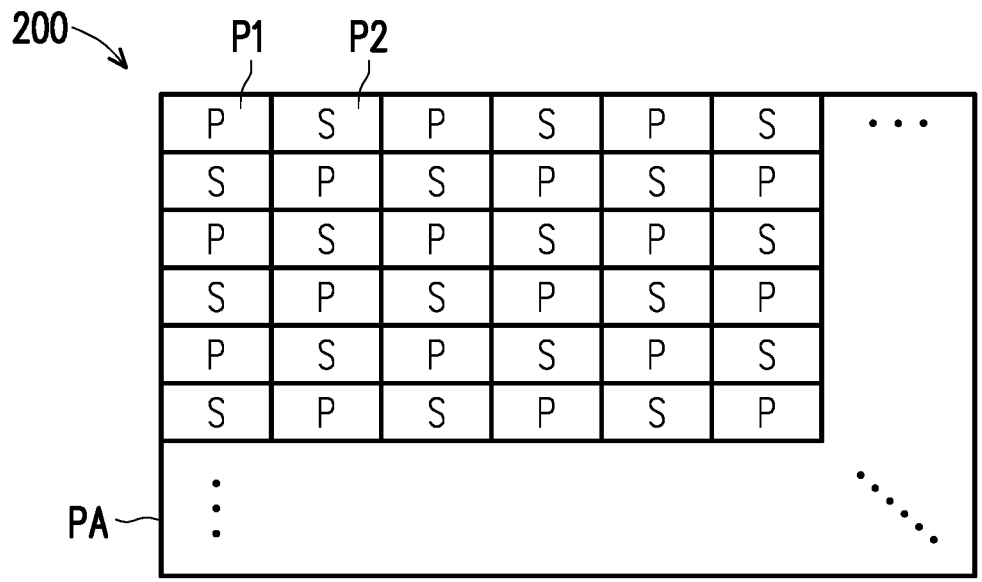
FIG. 8A is a schematic diagram illustrating a pixel matrix of a sensing element according to an exemplary embodiment.

FIG. 8A is a schematic diagram illustrating a pixel matrix of a sensing element according to an exemplary embodiment. With reference to FIG. 2, FIG. 6C, and FIG. 8A, the image capturing element 200 is a charge coupled device (CCD), a complementary metal oxide semiconductor transistor (CMOS), or another photosensitive element, for instance. In the present embodiment, the image capturing element 200 is a CMOS. The image capturing element 200 includes a pixel matrix PA constituted by a plurality of first pixels P1 and a plurality of second pixels P2 in a matrix, and the first pixels P1 and the second pixels P2 are alternately arranged. The first pixels P1 and the second pixels P2 can receive different polarization states of light, as shown in FIG. 8A. Namely, the structured light received by the first pixels P1 and the structured light received by the second pixels P2 of the image capturing element 200 are different. For instance, the first pixels P1 merely receive the first structured light LC1, and the second pixels P2 merely receive the second structured light LC2. Thereby, the positions of each part of the target object 10 may be identified according to the pattern distribution sensed by the first pixels P1 and the second pixels P2, so as to further improve sensing accuracy.

Figure 8B:
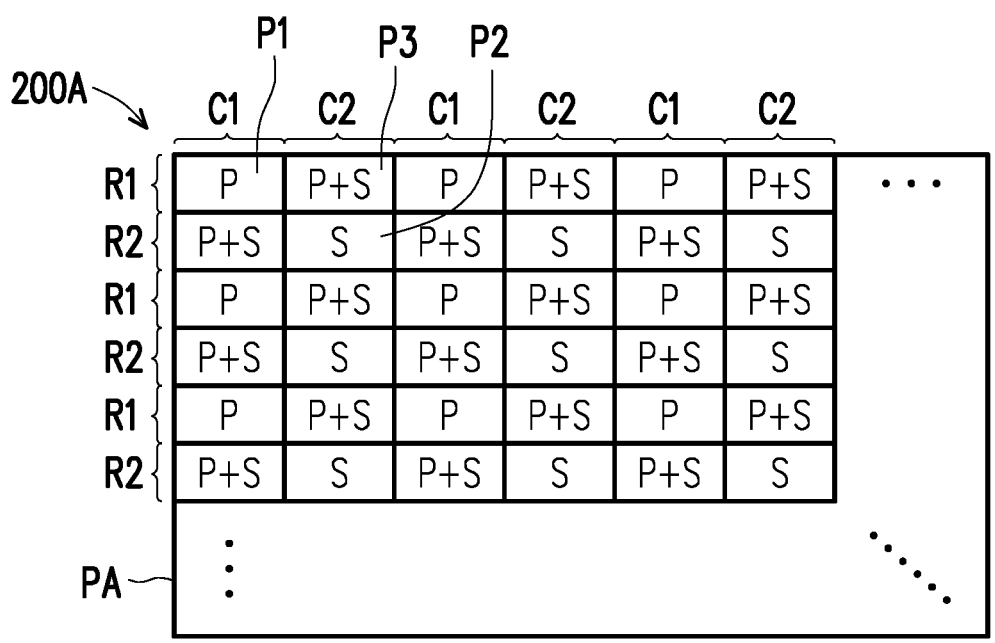
FIG. 8B is a schematic diagram illustrating a pixel matrix of a sensing element according to another exemplary embodiment.

FIG. 8B is a schematic diagram illustrating a pixel matrix of a sensing element according to another exemplary embodiment. With reference to FIG. 2, FIG. 6C, and FIG. 8B, the image capturing element 200A provided in the present embodiment is similar to the image capturing element 200 depicted in FIG. 8A, while the difference therebetween lies in that the image capturing element 200A provided in the present embodiment further includes a plurality of third pixels P3. The third pixels P3, the first pixels P1, and the second pixels P2 constitute the pixel matrix PA in a matrix manner. Odd-numbered rows R1 of the pixel matrix PA are composed of a portion of the first pixels P1 and a portion of the third pixels P3, and even-numbered rows R2 of the pixel matrix PA are composed of a portion of the second pixels P2 and a portion of the third pixels P3. Odd-numbered columns C1 of the pixel matrix PA are composed of a portion of the first pixels P1 and a portion of the third pixels P3, and even-numbered columns C2 of the pixel matrix PA are composed of a portion of the second pixels P2 and a portion of the third pixels P3. The first pixels P1, the second pixels P2, and the third pixels P3 can receive different polarization states of light. For instance, the first pixels P1 merely receive the first structured light LC1, the second pixels P2 merely receive the second structured light LC2, and the third pixels P3 receive the first structured light LC1 and the second structured light LC2. In some embodiments, the third pixels P3 may merely receive other polarization states, e.g., circular or elliptical polarization states. Thereby, the positions of each part of the target object 10 may be identified according to the pattern distribution sensed by the first pixels P1 and the second pixels P2, and the third pixels P3 may receive all light beams, so as to further improve sensing accuracy and sensing resolution.

Figure 9:
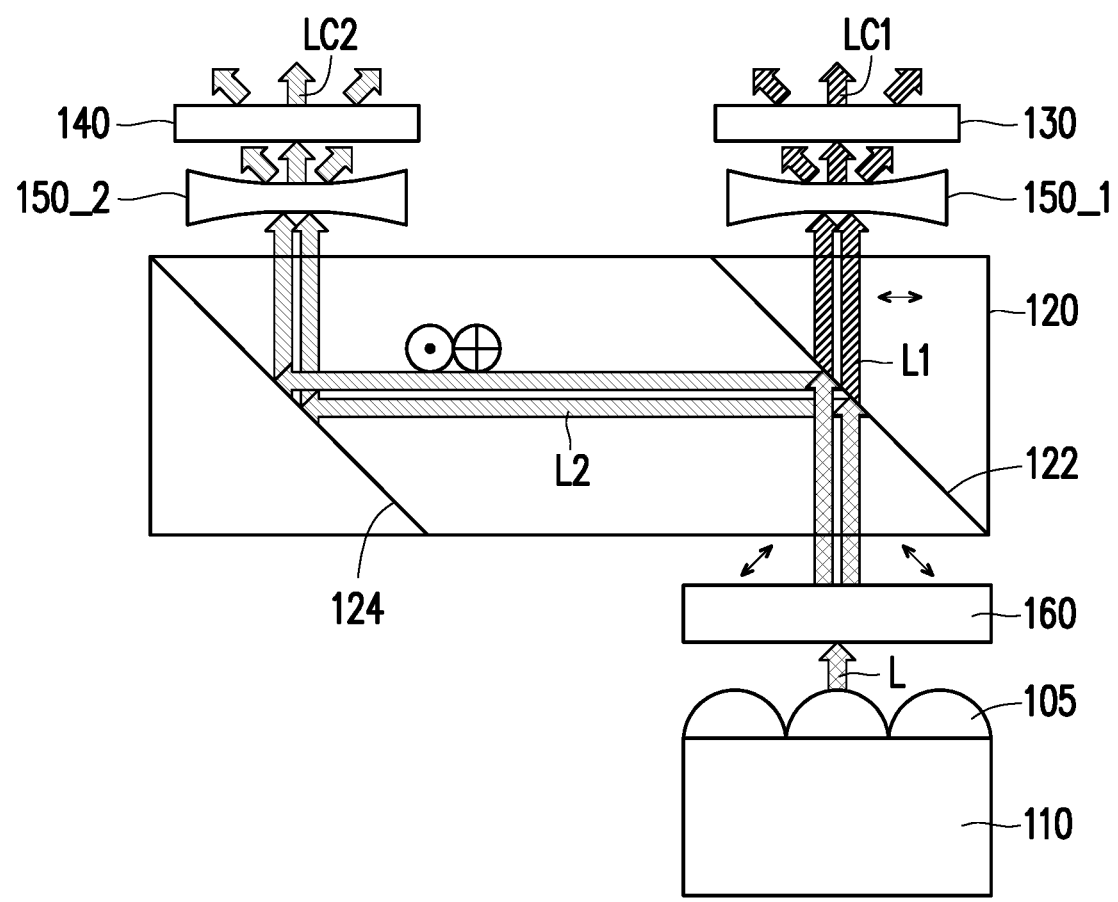
FIG. 9 is a schematic diagram illustrating a light source module according to another exemplary embodiment.

FIG. 9 is a schematic diagram illustrating a light source module according to another exemplary embodiment. With reference to FIG. 9, the light source module 100A provided in the present embodiment is similar to the light source module 100 depicted in FIG. 2, while the difference therebetween lies in that the light source module 100A provided in the present embodiment further includes a birefringent element 160 disposed on a transmission path of the light beam L between the light emitting device 110 and the light guiding element 120. The birefringent element 160 is, for instance, a liquid crystal material or birefringent crystal, which allows the light beam L passing the birefringent element 160 to produce two light beams with two different polarization directions. Therefore, when the light beam L passes through the birefringent element 160, two light beams of different polarization directions as shown in FIG. 9 may be generated and transmitted to the polarizing beam splitting element 122, and the two light beams are further divided into the first light beam L1 and the second light beam L2 according to the light splitting principle of the polarizing beam splitting element 122. As such, the density of the pattern distribution of the first structured light LC1 and the second structured light LC2 in the projection region may be doubled, so as to achieve the effect of replicating the patterns and further enhancing the identification accuracy.

Figure 10:
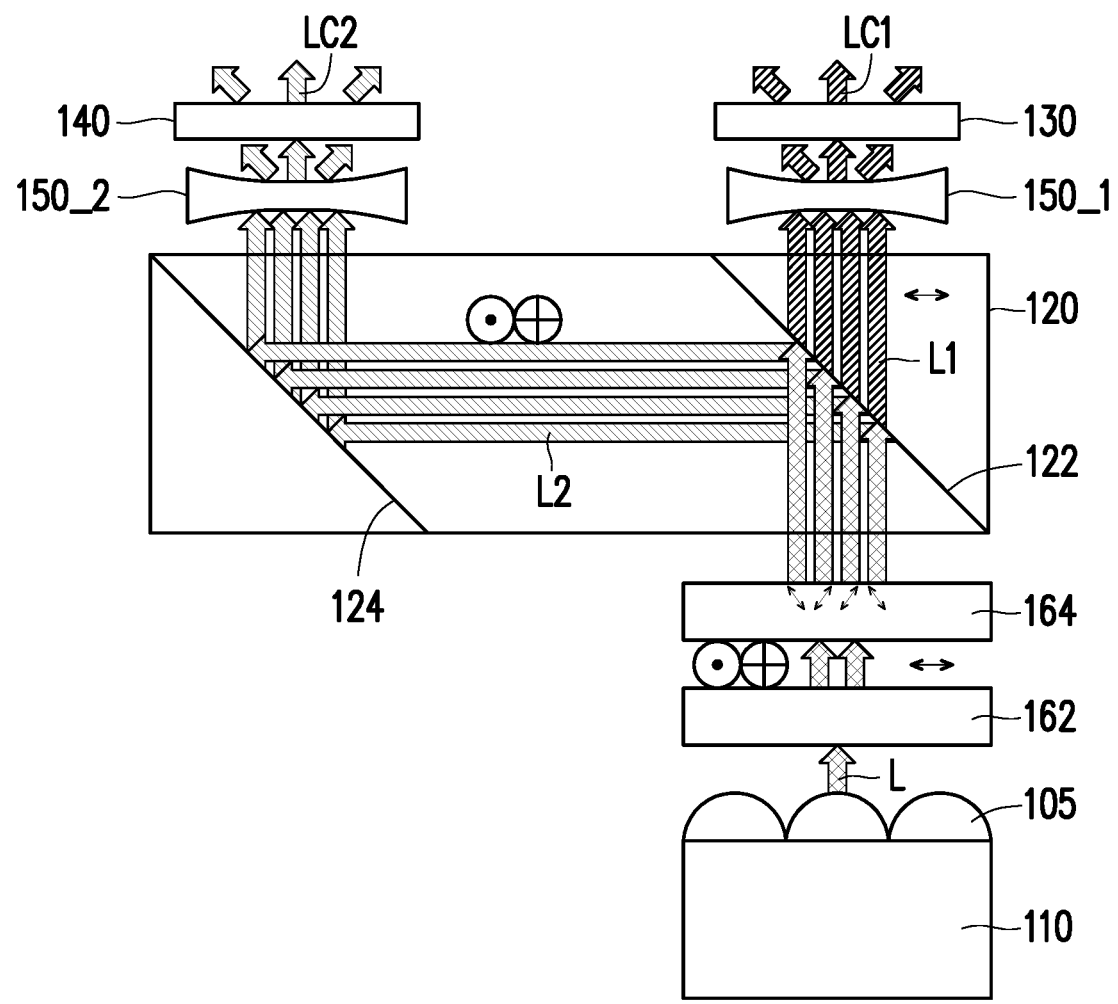
FIG. 10 is a schematic diagram illustrating a light source module according to another exemplary embodiment.

FIG. 10 is a schematic diagram illustrating a light source module according to another exemplary embodiment. With reference to FIG. 10, the light source module 100B provided in the present embodiment is similar to the light source module 100A depicted in FIG. 9, while the difference therebetween lies in that the light source module 100B provided in the present embodiment includes a first birefringent element 162 and a second birefringent element 164, and a direction of an optical axis of the first birefringent element 162 is different from a direction of an optical axis of the second birefringent element 164. Hence, after the light beams are split after passing through the first birefringent element 162 and the second birefringent element 164, and the polarization directions of the split light beams are different. The first birefringent element 162 and the second birefringent element 164 are disposed on the transmission path of the light beam L between the light emitting device 110 and the light guiding element 120. Therefore, when the light beam L passes through the first birefringent element 162, two light beams with different polarization directions as shown in FIG. 10 may be generated and transmitted to the second birefringent element 164, and the two light beams pass through the second birefringent element 164 and are split to four light beams with different polarization directions. According to the light splitting principle of the polarizing beam splitter 122, the four light beams are further divided into the first light beam L1 and the second light beam 2. As such, the density of the pattern distribution of the first structured light LC1 and the second structured light LC2 in the projection region may be doubled again, so as to achieve the effect of replicating the patterns and further enhancing the identification accuracy.

Figure 11:
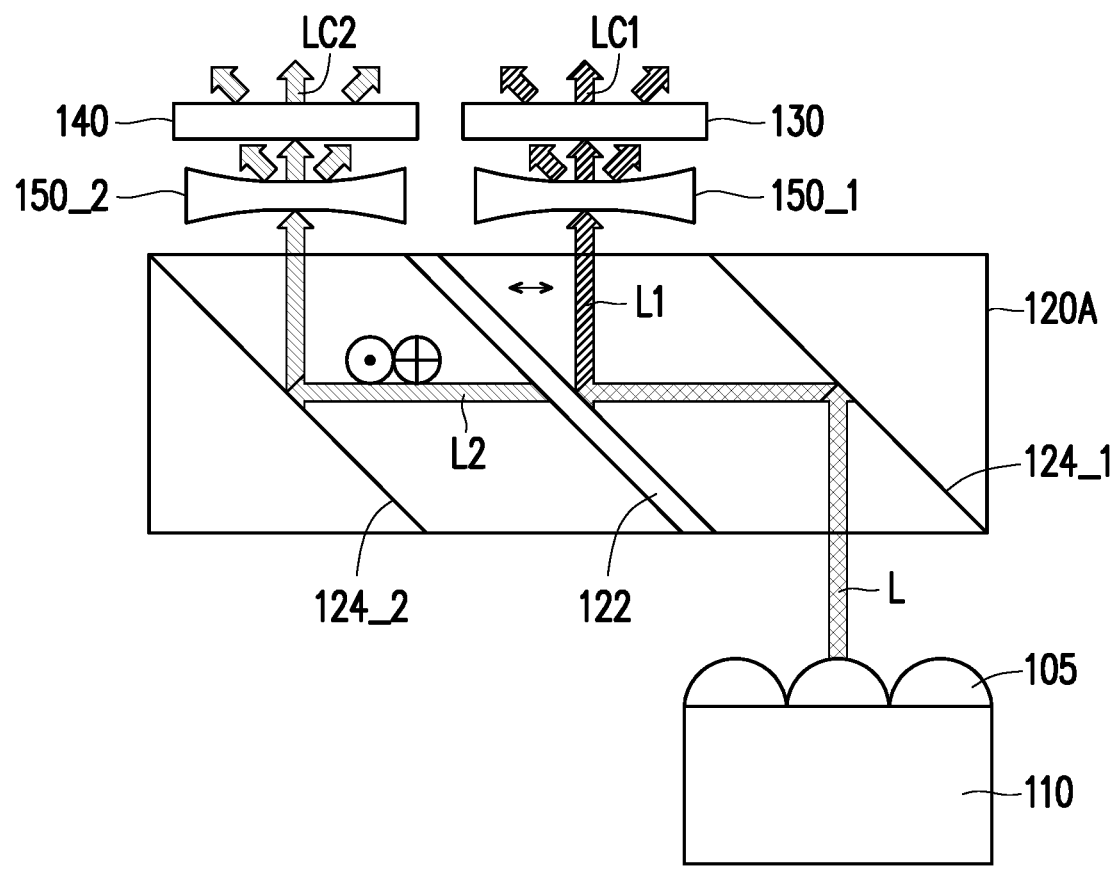
FIG. 11 is a schematic diagram illustrating a light source module according to another exemplary embodiment.

FIG. 11 is a schematic diagram illustrating a light source module according to another exemplary embodiment. With reference to FIG. 11, the light source module 100C provided in the present embodiment is similar to the light source module 100 depicted in FIG. 2, while the difference therebetween lies in that the light guiding element 120 of the light source module 100C provided in the present embodiment includes a first reflector 124_1 and a second reflector 124_2, and the polarizing beam splitter 122 is located between the first reflector 124_1 and the second reflector 124_2. The first reflector 124_1 is located on the transmission path of the light beam L to reflect the light beam L to the polarizing beam splitter 122, and second reflector 124_2 is located on the transmission path of the second light beam L2 to reflect the second light beam L2 to the second diffractive element 140. As such, if the product module requires a relatively long light path, the light source module 100C provided herein can still be applicable.

Figure 12:
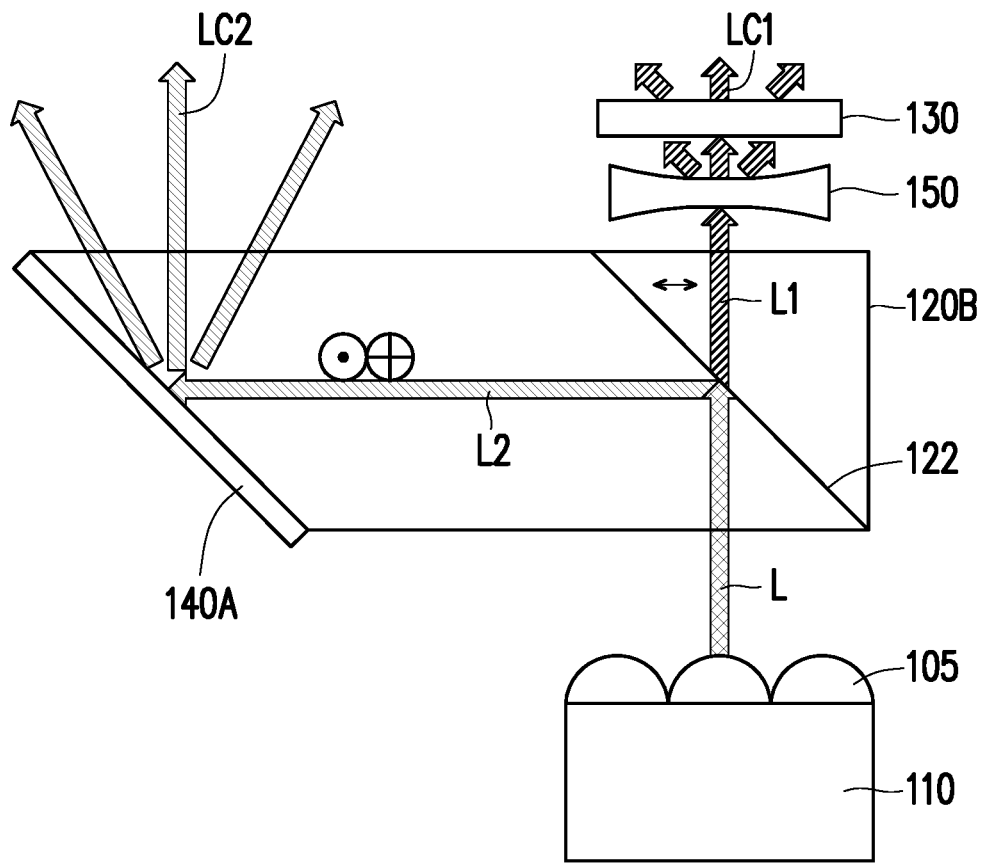
FIG. 12 is a schematic diagram illustrating a light source module according to another exemplary embodiment.

FIG. 12 is a schematic diagram illustrating a light source module according to another exemplary embodiment. With reference to FIG. 12, the light source module 100D provided in the present embodiment is similar to the light source module 100 depicted in FIG. 2, while the difference therebetween lies in that the second diffractive element 140A of the light source module 100D provided in the present embodiment is disposed on the light guiding element 120B. In other words, when the second light beam L2 is transmitted to the second diffractive element 140A, the second structured light LC2 may be generated. As such, one diffractive element set (i.e., the first diffractive element 130) and the corresponding set of light beams adjusting element 150 may be arranged on the light output side of the light guiding element 120B, whereby an effect of saving materials may be achieved.

In any of the above-mentioned embodiments, the first diffractive element 130 and the second diffractive element 140 may include an active diffractive device that provides a fixed dot matrix pattern or a variable dot matrix pattern, such as a liquid crystal panel and the like. That is, in some embodiments, an active diffractive panel may serve as the first diffractive element 130 and the second diffractive element 140 to project the superposition structured pattern to the target object 10. Hence, the sensing action may be performed by the active diffractive panels with different resolutions according to the level of fineness of the structure of the target object 10, which should not be construed as a limitation in the disclosure.

Figure 13:
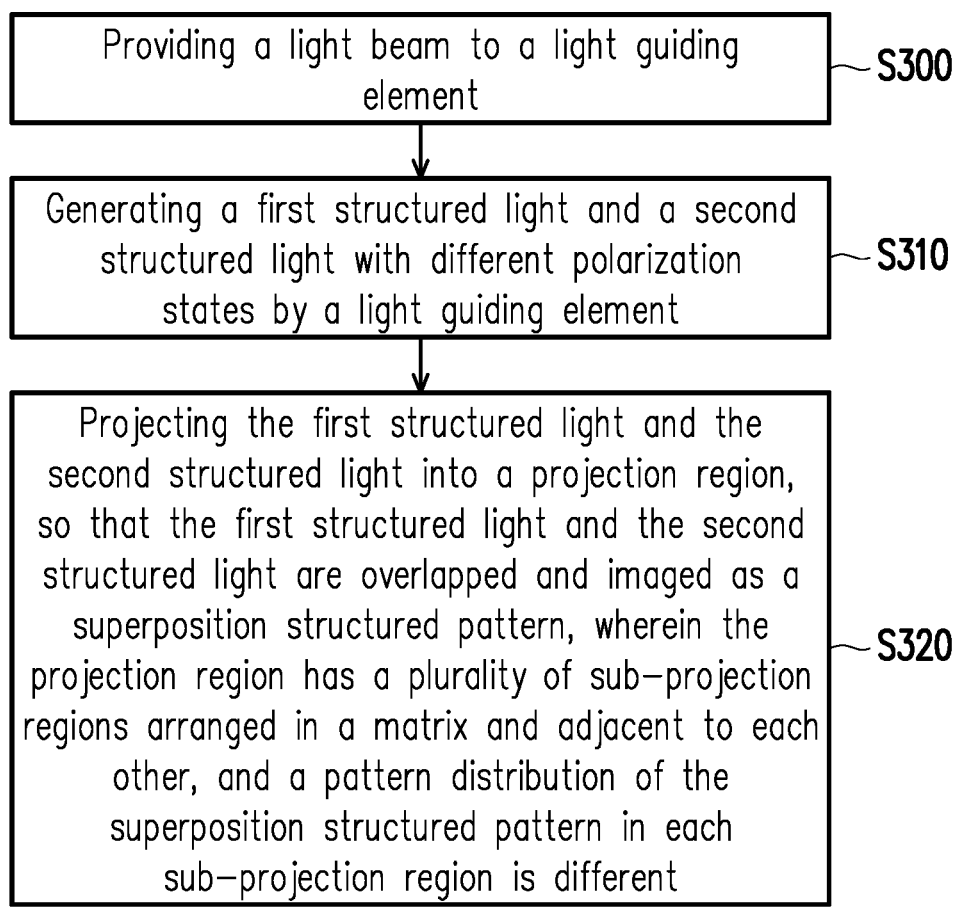
FIG. 13 is a flow chart of a method of generating a superposition structured pattern according to an exemplary embodiment.

FIG. 13 is a flow chart of a method of generating a superposition structured pattern according to an exemplary embodiment. With reference to FIG. 1, FIG. 2, FIG. 6C, and FIG. 13, the steps in the method of generating the superposition structured pattern shown in FIG. 13 may be applied to the light source module described in any of the previous embodiments. The light source module 100 depicted in FIG. 1 and FIG. 2 is taken as an example in the following explanatory paragraphs. According to the present embodiment, step S300 is performed to provide the light beam L to the light guiding element 200. After the step S300 is completed, step S310 is carried out to generate the first structured light LC1 and the second structured light LC2 with different polarization states by the light guiding element 200. After the step S310 is completed, step S320 is carried out to project the first structured light LC1 and the second structured light LC2 into a projection region APG, so that the first structured light LC1 and the second structured light LC2 are overlapped and imaged as the superposition structured pattern SP. Here, the projection region APG has a plurality of sub-projection regions AP arranged in a matrix and adjacent to each other, and the pattern distribution of the superposition structured pattern SP in each of the sub-projection regions AP is different from each other. Thereby, the depth value corresponding the projection position of the target object 10 may be sensed by performing the image capturing step to capture the superposition structure pattern SP, thereby obtaining the 3D information of the target object 10.

To sum up, in the light source module, the sensing device, and the method for generating the superposition structured pattern, the light emitting device of the light source module provides the light beam to the light guiding element and generates the first structured light and the second structured light with different polarization states through the light guiding element. The first structured light and the second structured light are projected into the projection region, so that the first structured light and the second structured light are overlapped and imaged as a superposition structured pattern. Thereby, the depth information of the illuminated object may be identified according to the difference in the pattern distribution in each sub-projection region and the variation amount thereof.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light source module adapted to provide a superposition structured pattern and comprising:
    a light emitting device adapted to provide a light beam;
    a light guiding element disposed on a transmission path of the light beam, the light guiding element comprising a polarizing beam splitter to separate the light beam into a first light beam and a second light beam;
    a first diffractive element disposed on a transmission path of the first light beam to convert the first light beam into a first structured light; and
    a second diffractive element disposed on a transmission path of the second light beam to convert the second light beam into a second structured light, wherein a polarization state of the first light beam is different from a polarization state of the second light beam, the first structured light and the second structured light are projected in a projection region, and overlapped and imaged as the superposition structured pattern, the projection region having a plurality of sub-projection regions arranged in a matrix and adjacent to each other, the superposition structured pattern having different pattern distributions in each of the plurality of sub-projection regions.

2. The light source module according to claim 1, wherein the first structured light and the second structured light are respectively imaged as a first structured pattern and a second structured pattern in the projection region, and the first structured pattern and the second structured pattern comprise dot matrix patterns with different arrangement periods.

3. The light source module according to claim 1, wherein an overlapping ratio of a first projection area defined by a projection boundary of the first structured light to a second projection area defined by a projection boundary of the second structured light in the projection region is greater than 80%.

4. The light source module according to claim 1, wherein a divergence angle of the first structured light and a divergence angle of the second structured light are different.

5. The light source module according to claim 1, wherein the light guiding element further comprises a reflector located on the transmission path of the second light beam to reflect the second light beam to the second diffractive element.

6. The light source module according to claim 1, further comprising:
    at least one birefringent element disposed on the transmission path of the light beam between the light emitting device and the light guiding element.

7. The light source module according to claim 6, wherein the at least one birefringent element comprises a first birefringent element and a second birefringent element, and a direction of an optical axis of the first birefringent element and a direction of an optical axis of the second birefringent element are different.

8. The light source module according to claim 1, wherein the light guiding element further comprises a first reflector and a second reflector, the polarizing beam splitter is located between the first reflector and the second reflector, the first reflector is located on the transmission path of the light beam to reflect the light beam to the polarizing beam splitter, and the second reflector is located on the transmission path of the second light beam to reflect the second light beam to the second diffractive element.

9. The light source module according to claim 1, wherein the second diffractive element is disposed on the light guiding element.

10. The light source module according to claim 1, wherein the first diffractive element is a transmissive diffractive element, and the second diffractive element is a reflective diffractive element or a transmissive diffractive element.

11. The light source module according to claim 1, wherein the first diffractive element is an active diffractive element or a passive diffractive element, and the second diffractive element is an active diffractive element or a passive diffractive element.

12. The light source module according to claim 1, wherein the first diffractive element and the second diffractive element comprises a display device providing a fixed dot matrix pattern or a variable dot matrix pattern.

13. The light source module according to claim 1, further comprising:
    a first light beam adjusting element disposed on the transmission path of the first light beam and located between the first diffractive element and the light guiding element; and
    a second light beam adjusting element disposed on the transmission path of the second light beam and located between the second diffractive element and the light guiding element.

14. A sensing device comprising:
    the light source module according to claim 1; and
    an image capturing element configured to capture an image in the projection region.

15. The sensing device according to claim 14, wherein the image capturing element comprises a pixel matrix, the pixel matrix comprises a plurality of first pixels and a plurality of second pixels, the plurality of first pixels and the plurality of second pixels are alternately arranged, and the plurality of first pixels and the plurality of second pixels receive light beams with different polarization states.

16. The sensing device according to claim 14, wherein the image capturing element comprises a pixel matrix, the pixel matrix comprises a plurality of first pixels, a plurality of second pixels, and a plurality of third pixels, odd-numbered rows of the pixel matrix are comprised of a portion of the plurality of first pixels and a portion of the plurality of third pixels alternately arranged, even-numbered rows of the pixel matrix are comprised of a portion of the plurality of second pixels and a portion of the plurality of third pixels alternately arranged, odd-numbered columns of the pixel matrix are comprised of a portion of the plurality of first pixels and a portion of the plurality of third pixels alternately arranged, even-numbered columns of the pixel matrix are comprised of a portion of the plurality of second pixels and a portion of the plurality of third pixels alternately arranged, and the plurality of first pixels, the plurality of second pixels, and the plurality of third pixels receive light beams with different polarization states.

17. A method of generating a superposition structured pattern, comprising:

provide a light beam to a light guiding element;

generating a first structured light and a second structured light with different polarization states by the light guiding element; and projecting the first structured light and the second structured light to a projection region, the first structured light and the second structured light being overlapped and imaged as a superposition structured pattern, wherein the projection region has a plurality of sub-projection regions arranged in a matrix and adjacent to each other, and the superposition structured pattern has different pattern distributions in each of the plurality of sub-projection regions.

18. The method according to claim 17, wherein the first structured light and the second structured light are respectively imaged as a first structured pattern and a second structured pattern in the projection region, and the first structured pattern and the second structured pattern comprise dot matrix patterns with different arrangement periods.

19. The method according to claim 17, wherein an overlapping ratio of a first projection area defined by a projection boundary of the first structured light to a second projection area defined by a projection boundary of the second structured light in the projection region is greater than 80%.

20. The method according to claim 17, wherein a divergence angle of the first structured light and a divergence angle of the second structured light are different.

\* \* \* \* \*